United States Patent
Mo et al.

(10) Patent No.: US 9,874,791 B2
(45) Date of Patent: Jan. 23, 2018

(54) DISPLAY DEVICE, ARRAY SUBSTRATE AND METHOD FOR MANUFACTURING ARRAY SUBSTRATE

(71) Applicants: BOE TECHNOLOGY GROUP CO., LTD., Beijing (CN); Chengdu BOE Optoelectronics Technology Co., Ltd., Chengdu, Sichuan Province (CN)

(72) Inventors: Zailong Mo, Beijing (CN); Tianlei Shi, Beijing (CN); Park Seoungyik, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 161 days.

(21) Appl. No.: 14/418,412

(22) PCT Filed: Apr. 18, 2014

(86) PCT No.: PCT/CN2014/075673
§ 371 (c)(1),
(2) Date: Jan. 29, 2015

(87) PCT Pub. No.: WO2015/085690
PCT Pub. Date: Jun. 18, 2015

(65) Prior Publication Data
US 2015/0338707 A1    Nov. 26, 2015

(30) Foreign Application Priority Data
Dec. 10, 2013 (CN) .......................... 2013 1 0667582

(51) Int. Cl.
*G02F 1/1343* (2006.01)
*G02F 1/1337* (2006.01)
(Continued)

(52) U.S. Cl.
CPC .... *G02F 1/134363* (2013.01); *G02F 1/13439* (2013.01); *G02F 1/133512* (2013.01);
(Continued)

(58) Field of Classification Search
CPC ........ G02F 2001/134372; G02F 2001/134381; G02F 2001/13373; G02F 1/134363; G02F 1/133707
See application file for complete search history.

(56) References Cited

U.S. PATENT DOCUMENTS

2002/0089630 A1   7/2002   Liu et al.
2003/0156237 A1   8/2003   Lin et al.
(Continued)

FOREIGN PATENT DOCUMENTS

CN   1700076 A   11/2005
CN   1716011 A   1/2006
(Continued)

OTHER PUBLICATIONS

Chinese International Search Report and Written Opinion dated Sep. 9, 2014 for PCT/CN2014/075673.
(Continued)

*Primary Examiner* — Jessica M Merlin
(74) *Attorney, Agent, or Firm* — Kinney & Lange, P.A.

(57) ABSTRACT

Disclosed is a display device, an array substrate and a method for manufacturing the same. The array substrate comprises a first transparent electrode layer, an insulating layer and a second transparent electrode layer disposed sequentially in a transmission direction of light, the second transparent electrode layer including a plurality of strip electrodes spaced apart from each other. At least one of edges of two adjacent strip electrodes facing to each other and a portion of the first transparent electrode layer corresponding to a space formed between the two adjacent strip
(Continued)

electrodes is formed with a protruding part protruding in the transmission direction so that a fringe electrical field formed by the edge of each of the strip electrodes and the first transparent electrode layer is shifted towards an edge side of the strip electrode. The present invention may limit an action rang of each of the fringing electrical fields of the each strip electrode and the first transparent electrode effectively. Even if a slight shift is occurred during an assembling operation of a color filter substrate and the array substrate, the adjacent sub-pixel unit will not be affected, so as to reduce the phenomenon of color mixing of the two adjacent sub-pixel units effectively.

20 Claims, 3 Drawing Sheets

(51) Int. Cl.
*G02F 1/1335* (2006.01)
*H01L 21/77* (2017.01)
*H01L 27/12* (2006.01)

(52) U.S. Cl.
CPC .. *G02F 1/133514* (2013.01); *G02F 1/133707* (2013.01); *H01L 21/77* (2013.01); *H01L 27/12* (2013.01)

(56) References Cited

U.S. PATENT DOCUMENTS

| | | | |
|---|---|---|---|
| 2010/0302492 A1* | 12/2010 | Kubota | G02F 1/134363 349/138 |
| 2012/0120337 A1* | 5/2012 | Ji | G02F 1/13394 349/39 |
| 2012/0133865 A1 | 5/2012 | Yonemura | |
| 2012/0257156 A1* | 10/2012 | Hiratsuka | G02F 1/134363 349/143 |
| 2014/0293199 A1* | 10/2014 | Sakae | G02F 1/134363 349/106 |

FOREIGN PATENT DOCUMENTS

| | | |
|---|---|---|
| CN | 101211072 A | 7/2008 |
| CN | 102914918 A | 2/2013 |
| CN | 103645589 A | 3/2014 |

OTHER PUBLICATIONS

First Office Action for corresponding CN Application No. 201310667582.4, dated Aug. 24, 2015, 5 pages.
International Search Report and Written Opinion for corresponding PCT Application No. PCT/CN2014/075673, dated Sep. 19, 2014, 5 pages.

* cited by examiner

DISPLAY DEVICE, ARRAY SUBSTRATE AND METHOD FOR MANUFACTURING ARRAY SUBSTRATE

BACKGROUND OF THE INVENTION

Field of the Invention

Embodiments of the present invention generally relate to a display device, and more particularly, to an array substrate for a display device, the display device comprising the array substrate and a method for manufacturing the array substrate.

Description of the Related Art

Display modes of a TFT-LCD (Thin Film Transistor-Liquid Crystal Display) mainly comprise TN (Twist Nematic), VA (Vertical Align), IPS (In Plane Switch) and the like, wherein VA and IPS belongs to the current mainstream of wide visual angle and basically solve problems of narrow visual angle and serious grayscale inversion in TN mode.

A multi-dimensional electrical field is formed through an electrical field generated at edges of slit pixel electrodes and an electrical field generated between a slit pixel electrode layer and a plate common electrode layer in the same plane based on an ADSDS (Advanced Super Dimension Switch) technique, so that all of aligned liquid crystal molecules between the slit pixel electrodes and directly above the slit pixel electrodes in a liquid crystal cell are driven to deflect, thereby improving operating efficiency of the liquid crystal molecules and increasing light transmittance. It is possible to improve quality of images of TFT-LCD products by using the Advanced Super Dimension Switch technique, so that the TFT-LCD has advantages of high resolution, high transmittance, low power consumption, wide visual angle, high aperture ratio, low chromatic aberration, no Push Mura and so on.

With the continuous improvement of resolution of the TFT-LCD products, a pixel is more and more small in size, and requirements on an aperture ratio of the pixel are more and more high. Thus, a width of a black matrix should be minimized as soon as possible. At the same time, since a common electrode of the ASDS product is generally made of indium tin oxide ITO having a relatively high resistance. In order to reduce RC delay and increase storage capacitance, an area of the common electrode will be increased as soon as possible when designing the common electrode, so that the ITO and a data line are generally designed to be overlapped with each other.

As illustrated in FIGS. 1 and 2, an existing ADSDS product with a high resolution comprises an array substrate and a color filter substrate. The array substrate includes a first layer ITO used as a common electrode 14', a second layer ITO used as a pixel electrode 16', an insulating layer between the common electrode 14' and the pixel electrode 16', and a metal data line 12'. The color filter substrate includes a plurality of black matrixes 22', a plurality of sub-pixel units 231'/232' and an organic planarization layer 24'. Each of the sub-pixel units generally comprises sub-pixel units of red, green and blue. The black matrixes 22' is disposed between the respective sub-pixel units 231' and 232' with the black matrix being located above the metal data line 12'.

FIG. 2 is a schematic cross-sectional view of the ADSDS product as shown in Figure taken along a direction A-B in which all of an organic planarization layer 13', the black matrixes 22', the sub-pixel units 231' and 232' and the organic planarization layer 24'may be made of resin materials, and the insulating layer 15' may be made of silicon nitride material. A liquid crystal layer 31' is located between the array substrate and the color filter substrate. When no electrical field is applied, liquid crystal molecules in the liquid crystal layer 31' will not be deflected and no lights are emitted from a display panel so that the display panel is in a black state. When a data voltage is applied to the sub-pixel units, the ITO pixel electrode and the ITO common electrode generate a fringe field 32', and the liquid crystal molecules in regions affected by the fringe field 32' will be deflected, such that an incident backlight 11' is formed as an emergent light 21' on one side of the color filter substrate after passing through the array substrate.

As shown in FIG. 3, since a width of the black matrix of the ADSDS product with high resolution is generally less than 6.0 μm, an overlapping width of the black matrix and the data line is small. If one side of the black matrix is shifted when the color filter is assembled with the array substrate, the fringe electrical field formed by the ITO of the pixel electrode and the ITO of the common electrode would be close to or even beyond the other side of the black matrix, i.e., a range of the liquid crystal layer which is deflected would be closed to or even beyond the other side of the black matrix. When a LCD separately displays red, green and blue images, i.e. the first sub-pixel unit 231' is applied with the data voltage and the adjacent sub-pixel unit 232' is not applied with the data voltage, minor emergent lights 25' would be generated on the other side of the black matrix close to the adjacent sub-pixel unit 232' in addition to the emergent light 21' of the first sub-pixel unit 231'. Therefore, the monochromatic emergent light such as red light of the first sub-pixel unit 231' is prone to be mixed with the monochromatic emergent light such as green light of the adjacent sub-pixel unit 232' to generate a mixed light such as yellow light and this issue will be more serious in a case of side visual angle.

SUMMARY OF THE INVENTION

The present invention has been made to overcome or alleviate at least one aspect of the above mentioned disadvantages. An embodiment of the present invention provides an array substrate which may avoid a phenomenon of color mixing due to slight shifts when assembling a color filter substrate and an array substrate.

According to an aspect of embodiments of the present invention, there is provided an array substrate comprising: a first transparent electrode layer, an insulating layer and a second transparent electrode layer disposed sequentially in a transmission direction of a light, the second transparent electrode layer including a plurality of strip electrodes spaced apart from each other, wherein at least one of edges of two adjacent strip electrodes facing to each other and a portion of the first transparent electrode layer corresponding to a space formed between the two adjacent strip electrodes is formed with a protruding part protruding in the transmission direction, so that a fringe electrical field formed by the edge of each of the strip electrodes and the first transparent electrode layer is shifted towards a side of the edge of the strip electrode.

In the array substrate as described above, the portion of the first transparent electrode layer corresponding to the space formed between the two adjacent strip electrodes is formed with a first protruding part protruding in the transmission direction.

In the array substrate as described above, edges of the two adjacent strip electrodes facing to each other are formed with second protruding parts protruding in the transmission direction.

In the array substrate as described above, the first transparent electrode layer is a common electrode and the second transparent electrode layer is a pixel electrode layer.

The array substrate as described above further comprises an organic planarization layer disposed below the first transparent electrode layer, a third protruding part being formed at a position on the organic planarization layer corresponding to each first protruding part.

In the array substrate as described above, a fourth protruding part is formed at a position on the insulating layer corresponding to the second protruding part of each of the strip electrodes.

In the array substrate as described above, a cross-sectional profile of the first protruding part has a triangular or parabolic shape.

In the array substrate as described above, an angel of the second protruding part of each of the strip electrodes relative to a horizontal portion of the strip electrode is formed less than 90 degrees.

In the array substrate as described above, the first protruding part has a width of 3.0~6.0 µm and a height of 2.0~4.0 µm.

In the array substrate as described above, the second protruding part of each of the strip electrodes has a width of 2.0~3.0 µm and a height of 2.0~3.0 µm.

According to another aspect of embodiments of the present invention, there is provided a display device comprising: a color filter substrate including a plurality of black matrixes and a plurality of sub-pixel units, each of the sub-pixel units being disposed between two corresponding black matrixes; and the array substrate according to any one of embodiments as described above, each black matrix between sub-pixel units corresponding to the protruding part formed on the first transparent electrode layer of the array substrate.

According to further aspect of embodiments of the present invention, there is provided a method for manufacturing an array substrate comprising steps of: depositing a first conductive thin film layer on a substrate; forming a first transparent electrode layer by the first conductive thin film layer through a patterning process; forming an insulating layer on the first transparent electrode layer; depositing a second conductive thin film layer on the insulating layer; and forming a second transparent electrode layer by the second conductive thin film layer through a patterning process, the second transparent electrode layer including a plurality of strip electrodes spaced apart from each other, wherein at least one of edges of two adjacent strip electrodes facing to each other and a portion of the first transparent electrode layer corresponding to a space formed between the two adjacent strip electrodes is formed with a protruding part protruding in a transmission direction of a light, so that a fringe electrical field formed by the edge of each of the strip electrodes and the first transparent electrode layer is shifted towards a side of the edge of the strip electrode.

In the method as described above, in the step of forming the first transparent electrode layer by the first conductive thin film layer through the patterning process, a plurality of first protruding parts are formed on the first transparent electrode layer, and in the step of forming the second transparent electrode layer by the second conductive thin film layer through the patterning process, a second protruding part is formed on the edge of each strip electrode corresponding to one of the first protruding parts.

In the method as described above, before performing the step of depositing the first conductive thin film layer on the substrate, an organic planarization layer is deposited on the substrate, a third protruding part is formed on the organic planarization layer, and the third protruding part is covered with the first protruding part.

In the method as described above, when performing the step of forming the insulating layer on the first transparent electrode layer, fourth protruding parts are formed on the insulating layer and a position at which each of the fourth protruding parts is formed corresponds to that at which the second protruding part of each strip electrode is formed.

In the method as described above, a cross-sectional profile of each of the first protruding part has a triangular or parabolic shape.

In the method as described above, an angel of the second protruding part of each of the strip electrodes relative to a horizontal portion of the strip electrode is formed less than 90 degree.

In the array substrate, the display device and the method for manufacturing the array substrate according to above various embodiments of the present invention, the first protruding part is formed at the portion of the first transparent electrode corresponding to the space of formed between the two adjacent strip electrodes, and/or the second protruding parts are formed by the edges of the two adjacent strip electrodes facing to each other, so that each fringe electrical field formed by the respective edges of the strip electrodes and the common electrode layer is shifted towards the edge side of the strip electrode. In this way, it is possible to limit an action range of each of the fringing electrical fields of the sub-pixel units effectively. Therefore, even if a slight shift is occurred during the assembling operation of the color filter substrate and the array substrate, the adjacent sub-pixel unit will not be affected. Thus, it is possible to reduce the phenomenon of color mixing of the two adjacent sub-pixel units effectively.

DETAILED DESCRIPTION OF PREFERRED EMBODIMENTS OF THE INVENTION

Figure 1:
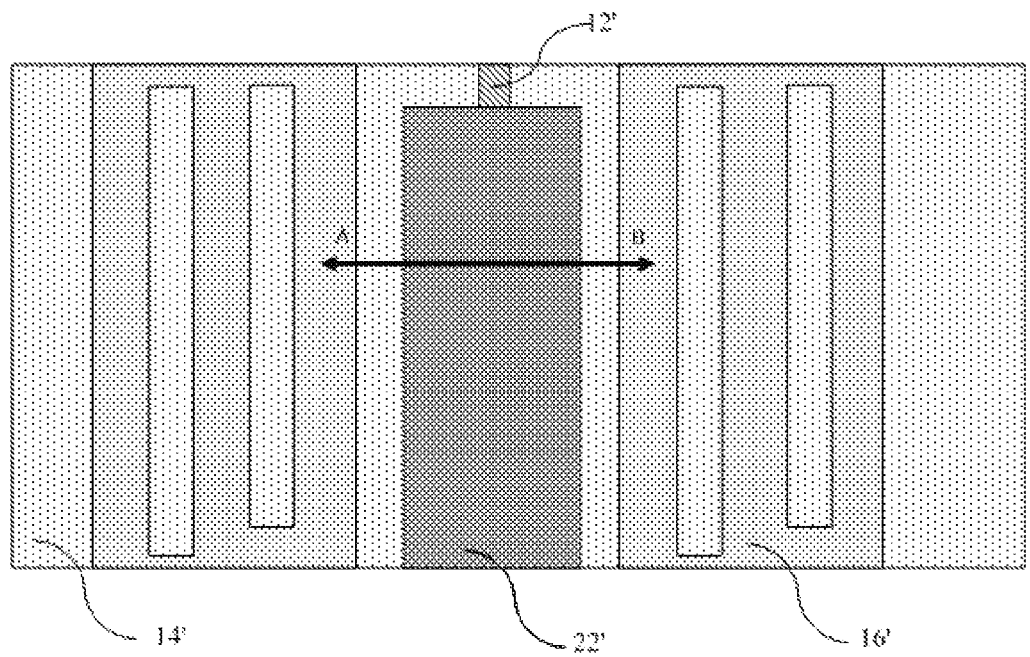
FIG. 1 is a principle plan view showing an array substrate in the prior art.
Figure 2:
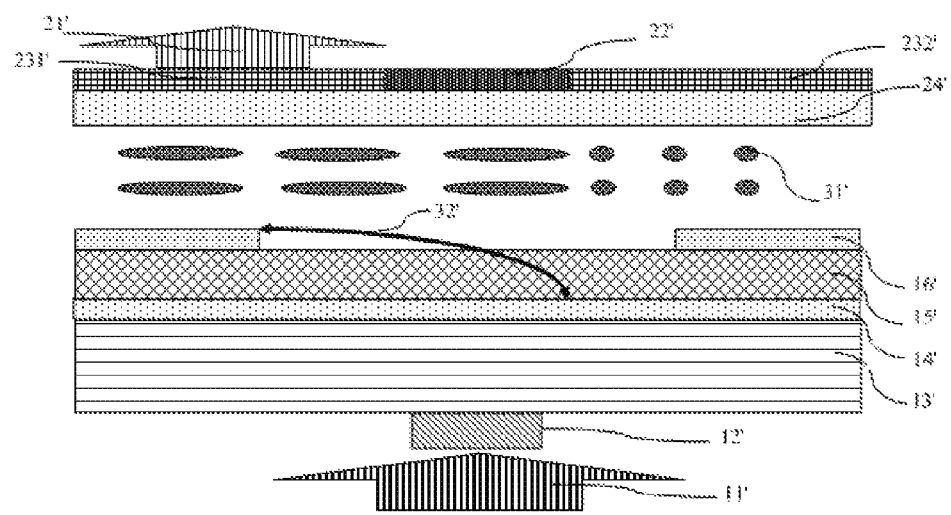
FIG. 2 is a schematic sectional view showing an array substrate in the prior art.
Figure 3:
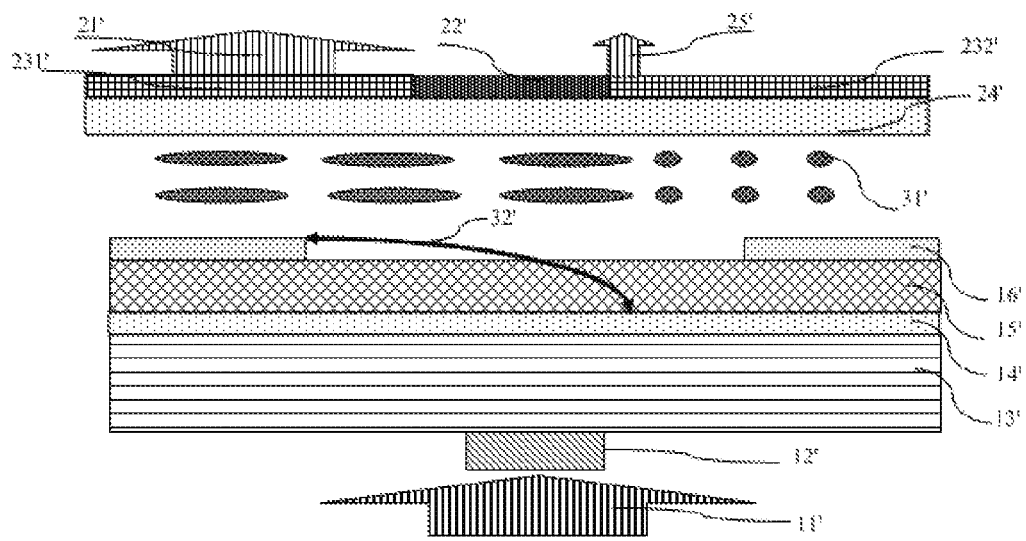
FIG. 3 is a schematic sectional section view showing the array substrate as shown in FIG. 2 when shifting during an assembling operation.

Specific implementations of the present invention will be described in details below with reference to accompanying drawings and embodiments. The following embodiments are intended to illustrate the present invention rather than limiting the scope thereof.

According to a general concept of the present invention, there is provided an array substrate comprising a first transparent electrode layer, an insulating layer and a second transparent electrode layer disposed sequentially in a transmission direction of a light, the second transparent electrode layer including a plurality of strip electrodes spaced apart from each other. At least one of edges of the two adjacent strip electrodes facing to each other and a portion of the first transparent electrode layer corresponding to a space formed between the two adjacent strip electrodes is formed with a protruding part protruding in the transmission direction so that a fringe electrical field formed by the edge of each of the strip electrodes and the first transparent electrode layer is shifted towards a edge side of the edge of the strip electrode.

In the array substrate of the present invention, by forming the protruding parts at the edges of the two adjacent strip electrodes facing to each other, and the portion of the first transparent electrode layer corresponding to the space of formed between the two adjacent strip electrodes, it is possible to shift each fringe electrical field formed by the respective edges of the strip electrodes and the first transparent electrode layer towards the edge side of the strip electrode so as to limit an action range of the fringing electrical fields of the sub-pixel units effectively. Therefore, even if a slight shift is occurred during the assembling operation of the color filter substrate and the array substrate, the adjacent sub-pixel unit will not be affected. Thus, it is possible to reduce the phenomenon of color mixing of the two adjacent sub-pixel units effectively.

In the array substrate of the present invention, the first transparent electrode layer may be a common electrode and the second transparent electrode layer may be a pixel electrode layer. The portion of the first transparent electrode layer corresponding to the space formed between the two adjacent strip electrodes is formed with a first protruding part protruding in the transmission direction, and the edges of the two adjacent strip electrodes facing to each other are formed with second protruding parts protruding in the transmission direction.

Specifically, a structure of the first protruding part formed on the common electrode layer may be of various forms. For example, when forming the common electrode layer, a thickness of the common electrode layer at a predetermined position may be formed to be larger than that at other positions, such that the first protruding part is formed at predetermined position. Alternatively, a third protruding part is firstly formed on an organic planarization layer located below the common electrode layer and above a first substrate, and then the common electrode layer is formed on the organic planarization layer, so as to form the first protruding part at a position on the common electrode layer corresponding to the third protruding part. Similarly, a structure of the second protruding parts of the strip electrodes of the pixel electrode layer may also be formed by the method as described above.

In the array substrate of an exemplary embodiment of the present invention, the third protruding part is formed at a position, which corresponds to the first protruding part, on the organic planarization layer located below the first transparent electrode layer to support the first protruding part. Fourth protruding parts protruding upwardly are formed at positions, each of which corresponds to the second protruding part of each of the strip electrodes, on the insulating layer between the second transparent electrode layer and the first transparent layer to support the second protruding part at the edge of each of the strip electrodes.

Figure 4:
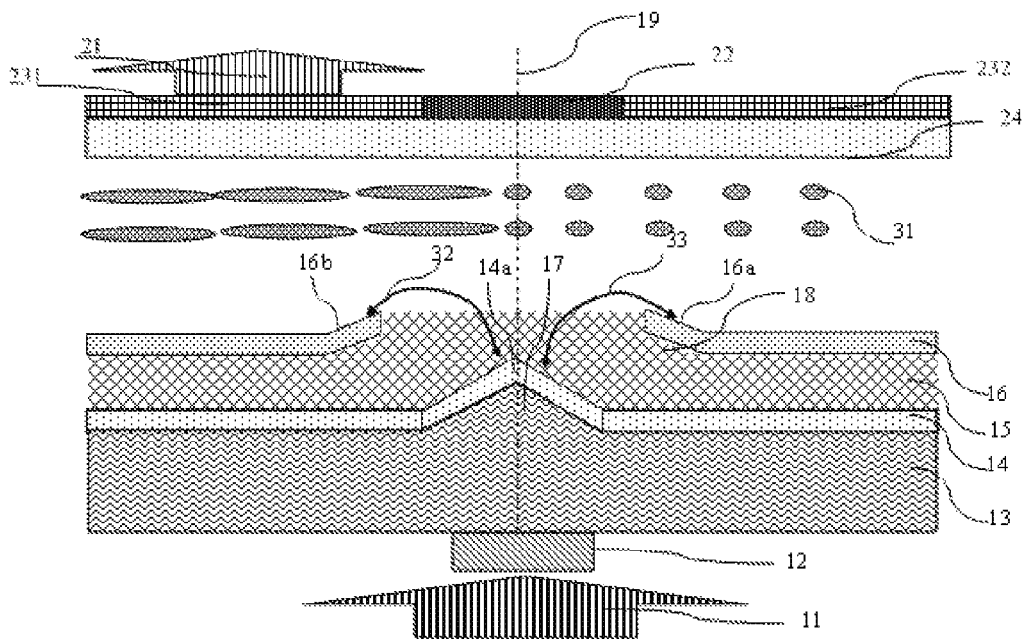
FIG. 4 is a schematic sectional view showing an array substrate according to an exemplary embodiment of the present invention.

FIG. 4 is a schematic sectional view showing an array substrate according to an exemplary embodiment of the present invention. The array substrate comprises a first substrate (not shown), an organic planarization layer 13, a common electrode layer 14, an insulating layer 15 and a pixel electrode layer 16 sequentially disposed in a transmission direction of a backlight 11. The pixel electrode layer 16 includes a plurality of strip electrodes 16a and 16b (two strip electrodes are shown in FIG. 4) spaced apart from each other.

The array substrate is provided with a color filter substrate thereon, and liquid crystals 31 are disposed between the array substrate and the color filter substrate. The color filter substrate comprises an organic planarization layer 24 being in contact with the liquid crystals 31, a black matrix 22 disposed on the organic planarization layer 24, and sub-pixel units 231 and 232 disposed on the organic planarization layer 24 and located at both sides of the black matrix respectively. Further, the black matrix 22 is disposed above a data line 12 to cover the data line 12. In an exemplary embodiment of the present invention, the strip electrode 16b is a pixel electrode corresponding to the sub-pixel unit 231, and the strip electrode 16a is a pixel electrode corresponding to the sub-pixel unit 232. The common electrode 14 is provided with a first protruding part 14a protruding in the transmission direction of the backlight 11 below a space formed between the strip electrodes 16a and 16b, i.e., below the black matrix 22. Furthermore, an edge of the strip electrode 16b corresponding to the first protruding part 14a protrudes upwardly in the transmission direction of the backlight 11 to form a second protruding part, and an edge of the strip electrode 16a corresponding to the first protruding part 14a protrudes upwardly in the transmission direction of the backlight 11 to form a second protruding part, so that a fringing electrical field 32 of the sub-pixel unit 231 is formed between the first protruding part 14a and the strip electrode 16a, and a fringing electrical field 33 of the sub-pixel unit 232 is formed between the first protruding part 14a and the strip electrode 16b. As shown in FIG. 4, a direction of the fringing electrical field 32 of the sub-pixel unit 231 is different from that of the fringing electrical field 33 of the sub-pixel unit 232, and the fringing electrical fields 32 and 33 are demarcated by a demarcation line 19 passing through a center of the first protruding part 14a.

Figure 5:
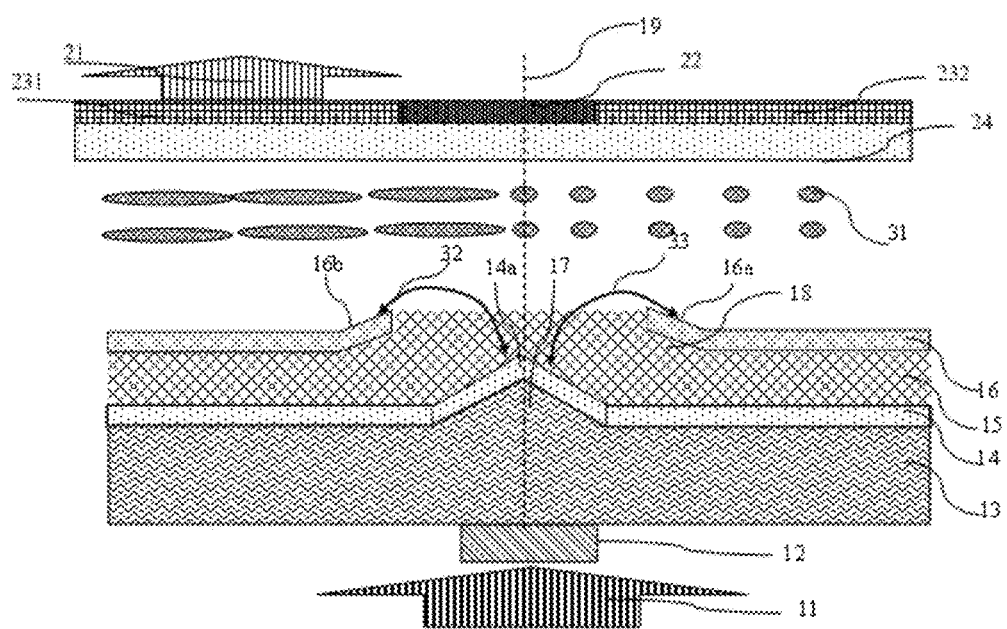
FIG. 5 is a schematic sectional section view showing the array substrate as shown in FIG. 4 when shifting during an assembling operation.

Referring to FIG. 5, when the color filter substrate and the array substrate are slightly shifted during an assembling operation, the black matrix 22 above the pixel electrode layer 16 is shifted towards one side at which the sub-pixel unit 231 is located, and a surface of the first protruding part 14a of the common electrode layer 14 is divided into two directions, at the same time, the second protruding part at the edge of the strip electrode 16b of the sub-pixel unit 231 also has a certain direction. When a data voltage is applied to the sub-pixel unit 231, an action rang of the fringing electrical field 32 of the sub-pixel unit 231 does not exceed the demarcation line 19 passing through the first protruding part 14a. Further, since the demarcation line 19 is still located below the black matrix 22, the fringing electrical field 32 of the sub-pixel unit 231 does not affect the adjacent sub-pixel unit 232, it is possible to effectively prevent the liquid crystals 31 in the region where the adjacent sub-pixel unit 232 is located from being rotated, so that the backlight 11 is only transmitted through the sub-pixel unit 231 to emit the emergent light 21 and cannot be transmitted through the sub-pixel unit 232, avoiding a phenomenon of the color mixing of the sub-pixel unit 231 and the sub-pixel unit 232.

Referring to FIG. 4, in this array substrate, the organic planarization layer 13 is disposed below the common electrode layer 14. A third protruding part 17 is formed at a position of the organic planarization layer 13 corresponding to the first protruding part 14a. That is, the third protruding part 17 is covered with the first protruding part 14a. In this way, the third protruding part 17 functions to support the first protruding part 14a.

In addition, in this array substrate, the insulating layer 15 is disposed between the common electrode layer 14 and the pixel electrode layer 16. This insulating layer 15 protrudes upwardly at portions corresponding to the edge potions, forming the second protruding parts protruding upwardly, of the strip electrodes 16a and 16b to form fourth protruding parts. For example, in the sub-pixel unit 232, a portion 18 of the insulating layer 15 corresponding to the edge, forming the second protruding part protruding upwardly, of the strip electrode 16a may be set to protrude upwardly in the transmission direction of the backlight 11 to form the fourth protruding part.

In the array substrate according to an exemplary embodiment of the present invention, a cross-sectional profile of the first protruding part may be of triangular or parabolic shape, preferably, may be of isosceles triangular shape. This first protruding part may be 3.0~6.0 82 m in width and may be 2.0~4.0 μm in height.

In the array substrate according to an exemplary embodiment of the present invention, the pixel electrode layer 16 may be 500 Å in thickness. The insulating layer 15 may be made of a silicon nitride material and may be 2000 Å in thickness. An angle of the edge of the strip electrode protruding upwardly, i.e., the second protruding part, relative to a horizontal portion of the strip electrode is less than 90 degrees. The width of the edge protruding upwardly may be 2.0~3.0 μm, the protruding height thereof may be 2.0~3.0 μm. The common electrode layer 14 may be 700 Å in thickness. The organic planarization layer 13 located on the first substrate may be made of a resin material and may be 2.0 μm in thickness.

In the array substrate according to embodiments of the present invention, the first protruding part is formed at the portion of the common electrode layer corresponding to the space formed between the two adjacent strip electrodes, and/or the second protruding parts corresponding to the first protruding part and protruding upwardly are formed by the edges of the two adjacent strip electrodes facing to each other, so that each fringe electrical field formed by the respective edges of the strip electrodes and the common electrode layer is shifted towards the edge side of the strip electrode. In this way, it is possible to effectively limit the action range of each of the fringing electrical fields of the sub-pixel units. Therefore, even if a slight shift is occurred during the assembling operation of the color filter substrate and the array substrate, the adjacent sub-pixel unit will not be affected. Thus, it is possible to reduce the risk of color mixing of the two adjacent sub-pixel units effectively.

In addition, the present invention further provides a display device comprising a color filter substrate and the array substrate as described in any one of the above embodiments. The color filter substrate comprises an organic planarization layer 24 and a plurality of black matrix and a plurality of sub-pixel units disposed on the organic planarization layer 24, each of the sub-pixel units being disposed between two black matrixes. The black matrix between each of the sub-pixel units corresponds to the protruding part disposed on the first transparent electrode layer of the array substrate.

The display device may include a liquid crystal display panel, a mobile phone, a tablet computer, a television, a display, a notebook computer, a digital picture frame, a navigation system and any other products or components having the display function.

Further, according to embodiments of another aspect of the present invention, there is also provided a method for manufacturing an array substrate comprising steps of: depositing a first conductive thin film layer on a substrate; forming a first transparent electrode layer by the first conductive thin film layer through a patterning process; forming an insulating layer on the first transparent electrode layer; depositing a second conductive thin film layer on the insulating layer; and forming a second transparent electrode layer by the second conductive thin film layer through a patterning process, the second transparent electrode layer including a plurality of strip electrodes spaced apart from each other. At least one of edges of two adjacent strip electrodes facing to each other and a portion of the first transparent electrode layer corresponding to a space formed between the two adjacent strip electrodes is formed with a protruding part protruding upwardly in a transmission direction of a light, so that a fringe electrical field formed by the edge of each strip electrode and the first transparent electrode layer is shifted towards the side of the edge of the strip electrode.

In the method for manufacturing the array substrate, in the step of forming the first transparent electrode layer by the first conductive thin film layer through the patterning process, a plurality of first protruding parts are formed on the first transparent electrode layer. In the step of forming the second transparent electrode layer by the second conductive thin film layer through the patterning process, a second protruding part is formed on the edge of each strip electrode corresponding to one of the first protruding parts.

Specifically, the first conductive thin film layer is deposited on the substrate as the first transparent electrode layer, and the first transparent electrode layer is provided with the first protruding parts at each position below the space formed between two adjacent strip electrode to be formed. When depositing the second conductive thin film layer on the substrate on which the above steps have been completed, patterns including each of the strip electrodes are formed by the patterning process, and the edge of each strip electrode corresponding to one of the first protruding parts protrudes upwardly to form the second protruding part.

Further, before performing the step of depositing the first conductive thin film layer on the substrate, an organic planarization layer is deposited on the substrate, a third protruding part is formed on the organic planarization layer, and the third protruding part is covered with the first protruding part.

Specifically, the first conductive thin film layer is deposited on the substrate as the first transparent electrode layer, and first transparent electrode layer is provided with the first protruding parts at each position below the space formed between two adjacent strip electrode to be formed. Before forming the first protruding parts, a first insulating thin film layer is deposited on the substrate as the organic planarization layer, the organic planarization layer being located below the first transparent electrode layer and a plurality of third protruding parts being formed on the organic planarization layer. Each of the third protruding parts corresponds to one of the first protruding parts to support the first protruding part.

In the method for manufacturing the array substrate of the present invention, when performing the step of forming an insulating layer on the first transparent electrode layer, fourth protruding parts are formed on the insulating layer, and a position at which each of the fourth protruding parts is formed corresponds to that at which the second protruding part of each strip electrode is formed.

Specifically, the first conductive thin film layer is deposited on the substrate as the first transparent electrode layer, and the first transparent electrode layer is provided with the first protruding parts at each position below the space formed between two adjacent strip electrode to be formed. After forming the first protruding parts, a second insulating thin film layer is deposited on the substrate, on which the first conductive thin film layer for forming the first transparent electrode layer has been deposited, as the insulating layer located between the second transparent electrode layer and the first transparent electrode layer, and the insulating layer is provided a plurality of protruding portions thereon to form the fourth protruding parts. Each of the protruding portions for forming the fourth protruding parts is in correspondence to the edge of one of the strip electrodes protruding upwardly.

Across-sectional profile of each first protruding part has a triangular or parabolic shape.

An angle of each of the second protruding parts, formed by the edge of each strip electrode protruding upwardly, relative to a horizontal portion of the strip electrode is formed less than 90 degrees.

The embodiments as described and shown above are intended to only illustrate the present invention, rather than limiting the present invention. It would be appreciated by those skilled in the art the embodiment various changes or modifications may be made in the embodiments in these embodiments without departing from the principle and spirit of the present invention. Thus, all the equivalent technical schemes of the present invention will fall within the scope thereof as defined by the appended claims.

What is claimed is:

1. An array substrate comprising:
a first transparent electrode layer, an insulating layer and a second transparent electrode layer disposed sequentially in a transmission direction of light, the second transparent electrode layer including a plurality of strip electrodes spaced apart from each other, that includes at least two adjacent strip electrodes facing each other disposed in two adjacent sub-pixel units respectively, a data line being formed between the two adjacent sub-pixel units,
wherein at least one of edges of the two adjacent strip electrodes facing each other and a portion of the first transparent electrode layer corresponding to a space formed between the two adjacent strip electrodes is formed with a protruding part protruding in the transmission direction, so that a fringe electrical field formed by the edge of each of the two adjacent strip electrodes and the first transparent electrode layer is shifted towards an edge side of the respective strip electrode disposed in the respective sub-pixel unit, the edges of the two adjacent strip electrodes facing each other are located on both sides of the data line respectively, the first transparent electrode layer is disposed between the data line and the second transparent electrode layer in the transmission direction of the light, and the portion of the first transparent electrode layer corresponding to the space formed between the two adjacent strip electrodes is overlapped with the data line at least partly.

2. The array substrate according to claim 1, wherein the portion of the first transparent electrode layer corresponding to the space formed between the two adjacent strip electrodes is formed with a first protruding part protruding in the transmission direction.

3. The array substrate according to claim 2, further comprising an organic planarization layer disposed below the first transparent electrode layer, a third protruding part being formed at a position on the organic planarization layer corresponding to each first protruding part.

4. The array substrate according to claim 2, wherein a cross-sectional profile of the first protruding part has a triangular or parabolic shape.

5. The array substrate according to claim 2, wherein the first protruding part has a width of 3.0~6.0 μm and a height of 2.0~4.0 μm.

6. A display device comprising
a color filter substrate including a plurality of black matrixes and a plurality of sub-pixel units, each of the sub-pixel units being disposed between two corresponding black matrixes; and
the array substrate according claim 1, each black matrix between sub-pixel units corresponding to the protruding part formed on the first transparent electrode layer of the array substrate.

7. The display device according to claim 6, wherein the portion of the first transparent electrode layer corresponding to the space formed between the two adjacent strip electrodes is formed with a first protruding part protruding in the transmission direction.

8. The display device according the claim 6, wherein edges of the two adjacent strip electrodes facing each other are formed with second protruding parts protruding in the transmission direction.

9. The display device according to claim 6, wherein the portion of the first transparent electrode layer corresponding to the space formed between the two adjacent strip electrodes is formed with a first protruding part protruding in the transmission direction, and the display device further comprises:
an organic planarization layer disposed below the first transparent electrode layer, a third protruding part being formed at the position on the organic planarization layer corresponding to each first protruding part.

10. The display device according to claim 6, wherein the edges of the two adjacent strip electrodes facing each other are formed with second protruding parts protruding in the transmission direction, and wherein a fourth protruding part is formed at a position on the insulating layer corresponding to the second protruding part of each of the strip electrodes.

11. The array substrate according to claim 1, wherein the edges of the two adjacent strip electrodes facing each other are formed with second protruding parts protruding in the transmission direction.

12. The array substrate according to claim 11, wherein a fourth protruding part is formed at a position on the insulating layer corresponding to the second protruding part of each of the two adjacent strip electrodes.

13. The array substrate according to claim 11, wherein an angle of the second protruding part of each of the two adjacent strip electrodes relative to a horizontal portion of each strip electrode is formed less than 90 degrees.

14. The array substrate according to claim 11, wherein the second protruding part of each of the strip electrodes has a width of 2.0~3.0 μm and a height of 2.0~3.0 μm.

15. The array substrate according to claim 1, wherein the first transparent electrode layer is a common electrode and the second transparent electrode layer is a pixel electrode layer.

16. A method for manufacturing an array substrate comprising steps of:
depositing a first conductive thin film layer on a substrate;

forming a first transparent electrode layer from the first conductive thin film layer through a patterning process;

forming an insulating layer on the first transparent electrode layer;

depositing a second conductive thin film layer on the insulating layer; and forming a second transparent electrode layer from the second conductive thin film layer through a patterning process, the second transparent electrode layer including a plurality of strip electrodes spaced apart from each other, that includes at least two adjacent strip electrodes facing each other disposed in two adjacent sub-pixel units respectively, a data line being formed between the two adjacent sub-pixel units, wherein at least one of edges of the two adjacent strip electrodes facing each other and a portion of the first transparent electrode layer corresponding to a space formed between the two adjacent strip electrodes is formed with a protruding part protruding in a transmission direction of light, so that a fringe electrical field formed by the edge of each of the two adjacent strip electrodes and the first transparent electrode layer is shifted towards an edge side of the respective strip electrode disposed in the respective sub-pixel unit, the edges of the two adjacent strip electrodes facing each other are located on both sides of the data line respectively, the first transparent electrode layer is disposed between the data line and the second transparent electrode layer in the transmission direction of light, and the portion of the first transparent electrode layer corresponding to the space formed between the two adjacent strip electrodes is overlapped with the data line at least partly.

17. The method according to claim 16, wherein in the step of forming the first transparent electrode layer by the first conductive thin film layer through the patterning process, a plurality of first protruding parts are formed on the first transparent electrode layer; and in the step of forming the second transparent electrode layer by the second conductive thin film layer through the patterning process, a second protruding part is formed on the edge of each strip electrode corresponding to one of the first protruding parts.

18. The method according to claim 17, wherein before performing the step of depositing the first conductive thin film layer on the substrate, an organic planarization layer is deposited on the substrate, a third protruding part is formed on the organic planarization layer, and the third protruding part is covered with the first protruding part.

19. The method according to claim 17, wherein when performing the step of forming the insulating layer on the first transparent electrode layer, fourth protruding parts are formed on the insulating layer, and a position, at which each of the fourth protruding parts is formed, corresponds to that at which the second protruding part of each strip electrode is formed.

20. The method according to claim 17, wherein a cross-sectional profile of each of the first protruding parts has a triangular or parabolic shape.

* * * * *